United States Patent
Capasso et al.

(10) Patent No.: US 6,400,744 B1
(45) Date of Patent: Jun. 4, 2002

(54) APPARATUS COMPRISING A QUANTUM CASCADE LASER HAVING IMPROVED DISTRIBUTED FEEDBACK FOR SINGLE-MODE OPERATION

(75) Inventors: Federico Capasso, Westfield; Alfred Yi Cho, Summit; Sung-Nee George Chu, Murray Hill; Claire F. Gmachi, New Providence, all of NJ (US); Ruedeger Koehler, Berlin (DE); Deborah Lee Sivco, Warren, NJ (US); Alessandro Tredicucci, Chiavari (IT)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/512,757

(22) Filed: Feb. 25, 2000

(51) Int. Cl.[7] .............................. H01S 5/00; H01S 3/08
(52) U.S. Cl. .............................. 372/96; 372/92; 372/45
(58) Field of Search ........................... 372/96, 92, 45

(56) References Cited

U.S. PATENT DOCUMENTS

| 5,502,787 A | 3/1996 | Capasso et al. ............. 385/123 |
| 5,901,168 A | 4/1999 | Baillargeon et al. .......... 372/96 |
| 6,167,072 A | 12/2000 | Zory, Jr. ...................... 372/46 |

FOREIGN PATENT DOCUMENTS

| EP | 0877454 | 11/1998 | ............. H01S/3/18 |

OTHER PUBLICATIONS

Abstract/Zusammenfassung/Abrege, No. 00307623.9, p. 1, An article comprising a OC–DFB laser is disclosed... Jul. 17, 1901, International Search Report Abstract.

Scamarcio et al., *Long–wavelength. . .* , Semicond. Sci. Technol., vol. 13, No. 11, pp. 1333–1339 (Nov. 1998).

Namjou et al., *Sensitive absorption. . .* , Optics Lett., vol. 23, No. 3, pp. 219–221 (Feb. 1998).

Namjou, K. et al. "Sensitive absorption spectroscopy with a room–temperature distributed–feedback quantum–cascade laser," *Optics Letters*, vol. 23, No. 3, pp. 219–221 (1998).

Kosterev, A. A. et al., "Methane concentration and isotopic composition measurements with a mid–infrared quantum–cascade laser," *Optics Letters*, vol. 24, No. 3, pp. 178–181, (1999).

Williams, R.M. et al., "Kilohertz linewidth from frequency-stablized mid–infrared quantum cascade lasers" *Optics Letters* vol. 24, No. 24, pp. 1844–1846 (1999).

*Primary Examiner*—Paul Ip
*Assistant Examiner*—Armando Rodriguez

(57) ABSTRACT

An article comprising a QC-DFB laser is disclosed. In the QC-DFB laser, an overlying grating structure achieves relatively strong coupling of the guided mode to the grating, and is thus highly effective in inducing single-mode operation even under cw operating conditions. The grating structure includes grooves etched in a plasmon-enhanced confinement layer (PECL) disposed adjacent and in contact with an upper metallic electrode. The grating structure and the PECL are designed such that in the grooves, the laser mode travelling in the waveguide can couple efficiently to the surface-plasmon at the electrode interface. This results in strong modulation of the laser mode, leading to strong modulation of, inter alia, the effective refractive index.

16 Claims, 4 Drawing Sheets

APPARATUS COMPRISING A QUANTUM CASCADE LASER HAVING IMPROVED DISTRIBUTED FEEDBACK FOR SINGLE-MODE OPERATION

GOVERNMENT CONTRACT

This invention was made with Government support under Contract DAAG55-98-C-0050. The Government has certain rights in this invention.

FIELD OF THE INVENTION

This invention pertains to quantum cascade (QC) lasers, and to apparatus and systems that comprise a QC laser. More particularly, the invention pertains to quantum cascade distributed feedback (QC-DFB) lasers.

ART BACKGROUND

QC lasers are unipolar semiconductor lasers that can be designed to emit light over a tunable range of infrared (IR) wavelengths. In particular, such lasers can be designed to emit in the mid-IR spectral region from about 3 $\mu$m to about 17 $\mu$m. This spectral range is important because, inter alia, absorption lines of many industrial gases and environmental pollutants lie therein. This suggests that QC lasers may have advantageous applications as radiation sources for absorption spectroscopy of such substances in, e.g., sensors for environmental surveys or process control.

A QC laser has a multilayer structure that forms an optical waveguide, including a core region of relatively large effective refractive index disposed between lower and upper cladding regions of relatively small effective refractive index. A cladding region is also referred to as a "confinement" region because the guided optical radiation tends to be confined within the higher-index region, i.e., within the core, whose boundaries are marked by the transition to the lower-index cladding regions.

The core region comprises a multiplicity of nominally identical repeat units, with each repeat unit comprising an active region and a carrier injector region. The active region has a layer structure selected to provide an upper and a lower energy state for carriers, which are typically electrons but may alternatively be holes. The separation between the upper and lower states is such that a carrier transition from the upper to the lower state may result in emission of a photon at an infrared wavelength $\lambda$.

The carrier injector region has a layer structure selected to facilitate the transport of carriers occupying the lower energy state of the active region of a given repeat unit to the active region of the adjacent, downstream repeat unit, such that the transported carriers will occupy the upper energy state of the downstream active region. A carrier thus undergoes successive transitions from an upper to a lower energy state as the carrier moves through the layer structure, meanwhile emitting multiple photons of wavelength $\lambda$. The photon energy, and thus the wavelength $\lambda$, depends on the structural and compositional details of the repeat units.

One desirable property of QC lasers, particularly in applications involving precise spectroscopic measurements, is single-mode operation, as defined by a suppression of side modes by a factor of typical order 1000 (in measurements of the optical power). Early QC lasers were incapable of single-mode emission in continuous wave (cw) operation at cryogenic temperatures (below about 140 K) and in pulsed operation at room temperature. Typical emission spectra of QC-lasers are multiple-mode.

U.S. Pat. No. 5,901,168, which issued on Apr. 27, 1999 to J. N. Baillargeon et al. under the title "Article Comprising an Improved QC Laser" and is commonly assigned herewith, describes an improved QC laser capable of single-mode operation. The single-mode operation was achieved through the use of a grating structure for providing distributed feedback. The grating structure was specifically designed to induce single-mode operation. Because a grating structure was used for distributed feedback, the laser described there belonged to the class referred to as QC-DFB lasers.

Significantly, the benefits of single-mode emission were achieved in U.S. Pat. No. 5,901,168 using a grating structure fabricated on the upper surface of the device, and not a buried grating structure formed adjacent the core layer (although the cited patent also reported on results obtained using such a buried structure). The use of an overlying, and not a buried, grating structure is advantageous because it substantially simplifies the fabrication process. However, because of greater separation from the core layer, an overlying grating structure has generally been believed to offer weaker coupling of the optical mode to the grating than a buried grating structure, and consequently to have a weaker effect. In particular, coupling via a modulation by a surface grating of the effective refractive index of the modes was believed to be inefficient. In fact, early QC-DFB lasers fabricated with surface gratings did not operate in grating-induced single-mode emission when operated in cw. The latter requires a strong coupling between the guided mode and the grating.

There remains a need for QC-DFB lasers having still higher output powers and, in particular, operable with single-mode cw output. However, mode instability tends to be aggravated as temperatures and power levels increase. Strongly mode-coupled structures are needed to counter such spectral instability. Thus, one recognized problem in the art has been to provide mode stabilization sufficient to extend the range of single-mode operation with respect to optical output power and possibly operating temperature, particularly for cw conditions, while continuing to enjoy the convenience afforded to the fabrication process by using overlying, rather than buried, grating structures.

SUMMARY OF THE INVENTION

We have devised an overlying grating structure that achieves relatively strong coupling of the guided mode to the grating, and is thus highly effective in inducing a QC-DFB laser for single-mode operation even under cw operating conditions. Using such a grating structure, we have demonstrated continuously tunable, pulsed, single-mode operation at room temperature, and the first grating-induced continuously tunable, cw, single-mode operation at and above liquid nitrogen temperature, i.e., at and above 77K.

Our invention is embodied in an article (e.g., an absorption spectroscopy system) that comprises a QC-DFB laser. The QC-DFB laser comprises first and second cladding regions and a core region disposed between them. The core region comprises a multiplicity of multilayer semiconductor repeat units selected for lasing at a wavelength $\lambda$. The QC-DFB laser further comprises a grating structure for providing distributed feedback to facilitate single-mode laser operation. The grating structure overlies the core and is separated therefrom by at least a portion of the upper cladding region. The grating structure is overlain by an upper metallic electrode.

At least part of the grating structure is formed as a series of grooves (also referred to herein as "valleys") etched in a semiconductor layer, denominated the plasmon-enhanced confinement layer (PECL), which is disposed adjacent and in contact with the upper metallic electrode. The refractive index of the PECL at the lasing wavelength λ is typically significantly lower than the refractive index of any of the cladding layers that underlie it. A guided waveguide mode of the laser will experience an effective refractive index at the midpoint positions of the grooves that is different from the effective refractive index at the midpoint positions between the grooves.

The thickness, refractive index (as adjusted through doping), and etched depth of the PECL are chosen such that the effective refractive index changes between the intra-groove midpoint positions and the inter-groove midpoint positions by at least $2 \times 10^{-3}$ and possibly by as much as $1 \times 10^{-2}$ or even more, although a currently preferred value is about $5 \times 10^{-3}$.

The properties of the PECL are chosen such that near the intra-groove midpoint positions, where PECL material is substantially or even entirely removed, the laser mode travelling in the waveguide can couple efficiently to the surface-plasmon, which exists at the interface between the upper cladding layers and the overlying electrode. This has the effect of "pulling" the mode toward the surface and thereby changing its overlap with the various layers constituting the waveguide. Near the inter-groove mid-point positions, where the PECL is intact, the coupling to the surface-plasmon is at least partially suppressed, effectively "pushing" the mode away from the surface. This "push-pull" action (periodic with the grating period) is responsible for a relatively strong modulation of the refractive index. Secondarily, it also induces a modulation of the modal gain via a modulation of the confinement factor, defined as the overlap of the guided mode with the waveguide core, i.e., with the multiplicity of active regions and injectors. (It should be noted that the spatially modulated coupling to the inherently lossy surface-plasmon furthermore induces a loss modulation.)

A "push" or "pull" of the laser mode refers to a relative decrease or increase, respectively, in amplitude of the electromagnetic field of the laser radiation near the feature of interest, i.e., the PECL or grating. The amount of "push-pull" can be quantified by the change in confinement factor, and is preferably designed to be approximately 10%–20% (as absolute percentages of the waveguide confinement), but can be made even higher if desired.

BRIEF DESCRIPTION OF THE DRAWING

FIG. 3 shows emission wavelength as a function of heat sink temperature. FIG. 4 shows voltage and optical output power as functions of current.

FIG. 5 shows emission wavelength as a function of heat sink temperature near laser threshold and as a function of drive current at constant 80K heat sink temperature. FIG. 6 shows voltage as a function of current at 80K heat sink temperature, and also shows optical output power as a function of current at heat sink temperatures of 60K and 80K.

DETAILED DESCRIPTION

Figure 1:
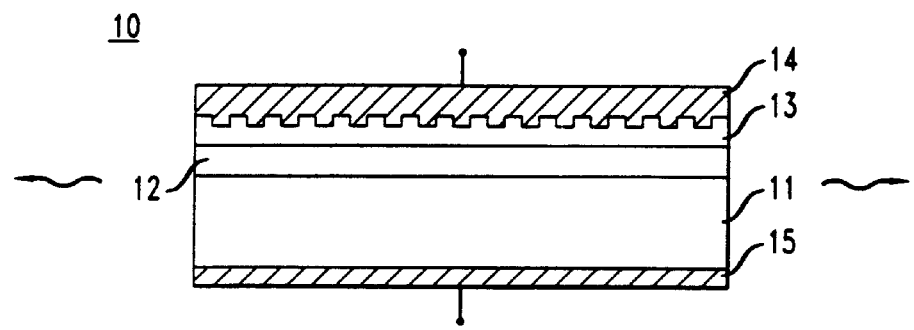
FIG. 1 is a high-level schematic representation of a QC-DFB laser.

FIG. 1 schematically shows an exemplary QC-DFB laser 10. Numerals 11–13 refer respectively to the lower confinement region, the QC active region, and the upper confinement region, including a grating on the top surface. Numerals 14 and 15 refer to metallization layers. The wavy arrows indicate output radiation.

An exemplary embodiment of the present invention was configured for nominal laser emission at a wavelength of about 4.5 μm. We measured tunable emission from the exemplary embodiment over a wavelength range of about 4.60–4.75 μm. As will be appreciated by those skilled in the art, the exemplary configuration can be scaled for operation at other wavelengths by suitable adjustments in layer thicknesses, material composition, doping levels, and grating period. In the exemplary embodiment, lower confinement region 11 was a portion of the InP substrate, at a relatively low doping level of about $2 \times 10^{17}$ cm$^{-3}$. All doping in the exemplary embodiment was n-type, using silicon.

QC active region 12 consisted of 26 repeat units, each repeat unit comprising an active region and an injector region. The total number of repeat units in an effective laser of the inventive kind may be as few as 1 and as many as about 75. Typical numbers of repeat units lie in the range 25–30. The repeat units were embedded in a waveguide core of In$_{0.53}$Ga$_{0.47}$As doped at a relatively low level of $1 \times 10^{17}$ cm$^{-3}$ and grown lattice-matched to the InP substrate. More details of the QC active region are provided below.

Upper confinement region 13 consisted of: a lower layer of Al$_{0.48}$In$_{0.52}$As 1.5 μm thick and doped to $3 \times 10^{16}$ cm$^{-3}$ overlain by a further layer of Al$_{0.48}$In$_{0.52}$As 0.62 μm thick and doped to $3 \times 10^{17}$ cm$^{-3}$, overlain in turn by the PECL. The PECL was formed as a layer of Al$_{0.48}$In$_{0.52}$As 0.15 μm thick and doped to the relatively high level of $4 \times 10^{19}$ cm$^{-3}$.

Digitally graded transition layers, 25–30 nm thick, were grown between bulk-like materials, e.g., between the core region and the InP substrate, and in the transition between InGaAs and AlInAs in the upper cladding region.

Within the QC active region, the stack of 26 repeat units was bounded from below by a layer of In$_{0.53}$Ga$_{0.47}$As 0.2 μm thick, and bounded from above by a layer of In$_{0.53}$Ga$_{0.47}$As 0.22 μm thick. The stack of repeat units began and ended with an injection region. Each repeat unit had the structure listed in Table 1.

The barrier and well compositions within the repeat units were selected to have lattice strain of opposite sign relative to the InP substrate, so that the accumulated strain for all layers of one repeat unit would effectively be zero. A QC laser incorporating such strain engineering is described in U.S. Pat. No. 6,023,482, issued to F. Capasso et al. on Feb. 8, 2000 under the title "Article Comprising a Strain-Compensated QC Laser" and commonly assigned herewith.

As mentioned above, the barrier-and-well structure within the active region of each repeat unit is designed to have an upper and a lower carrier-energy level, with transitions between them that result in optical emission at the laser emission wavelength. At the design electric field of 70 kV/cm, the energy separation between these levels was 278 meV, corresponding to an emission wavelength of about 4.5 µm.

The grating, which was designed to be a first-order Bragg-grating, was fabricated by optical contact lithography, $O_2$ plasma processing of the resist grating, and wet etching in $HBr:HNO_3:H_2O=1:1:10$ to a depth of approximately 0.20 µm. This etch depth was sufficient to entirely remove the PECL material from the valley portions of the grating. The etched grating was subsequently covered with top contact metallization of 30 nm Ti/300 nm Au.

We cleaved the lasers to a length of 2.25 mm, which would theoretically yield a coupling product (i.e., coupling coefficient times length) of 3.6, a target design value which has previously been shown to yield reliable single-mode QC-DFB lasers. Stripe widths were 8–11 µm.

The laser processing and measurement procedures were conventional, and are described, for example, in the article by C. Gmachl et al., "Continuous-wave and high-power pulsed operation of index-coupled distributed feedback quantum cascade laser at $\lambda \approx 8.5$ µm," *Appl. Phys. Lett.* 72 (1998) 1430–1432.

Figure 2:
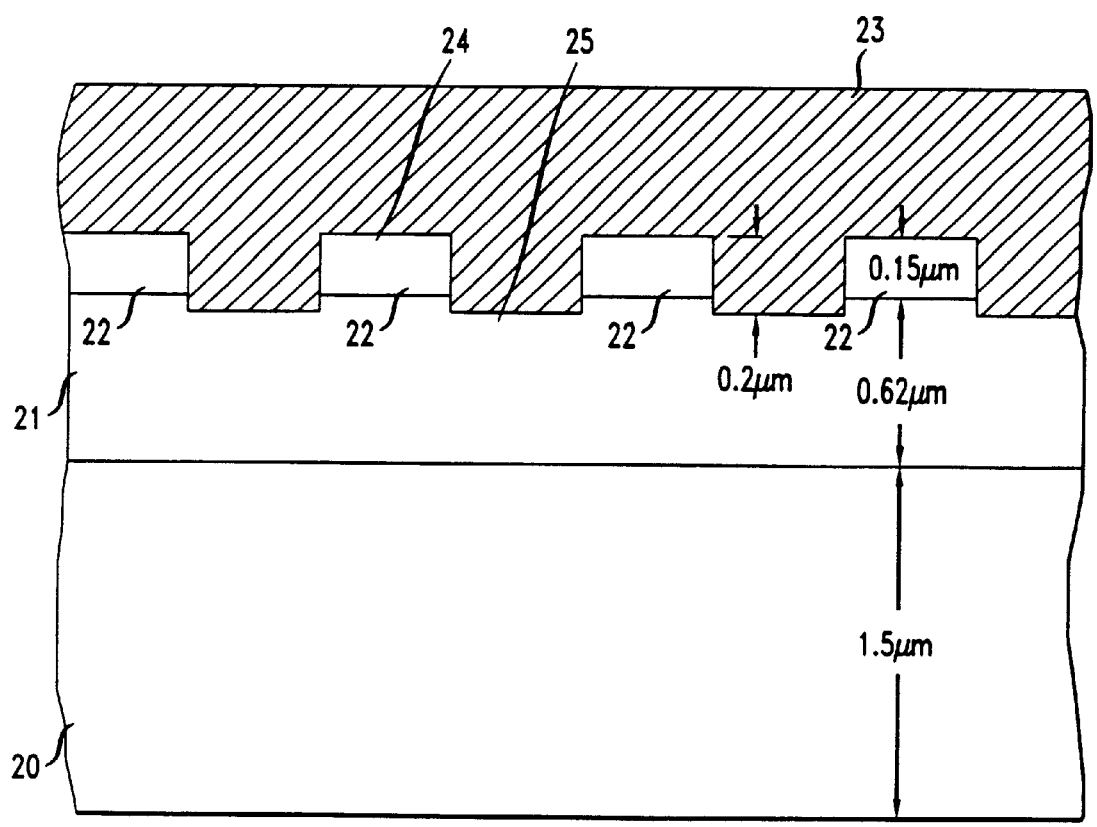
FIG. 2 is a schematic representation of the upper confinement region and the upper metallic electrode of an exemplary QC-DFB laser according to the present invention.

FIG. 2 shows, in schematic fashion, the upper confinement region and the upper metallic electrode of the exemplary QC-DFB laser. Layer 20, as noted above, is AlInAs doped to $3 \times 10^{16}$ cm$^{-3}$ and 1.5 µm thick. Layer 21, as noted above, is AlInAs doped to $3 \times 10^{17}$ cm$^{-3}$ and 0.62 µm thick (before etching). Layer 22, as noted above, is the PECL, made of AlInAs doped to $4 \times 10^{19}$ cm$^{-3}$ and 0.15 µm thick before etching. Layer 23 is the upper metallic electrode. As shown in the figure, a grating is etched entirely through layer 22 and partway into layer 21. The grating includes ridge portions 24 and valley (or "groove") portions 25. Material has been removed from the valley portions by etching. As seen in the figure, the valley portions have been filled with electrode material. The precise manner of filling in the valleys is conventional and need not be described here in detail.

One effect of the PECL is to reduce the amplitude of the guided waveguide mode of the laser in portions of the upper cladding region that lie adjacent electrode 23. This is an important effect because when the guided mode has appreciable amplitude at the interface between the upper cladding and the electrode, a significant amount of optical loss is brought about by energy dissipation within the electrode material, and similarly the mode is pulled toward the surface (the electrode) and out of the active waveguide core.

It has been known in the past that a PECL is useful for suppressing optical, amplitude at that semiconductor-metal interface. For example, U.S. Pat. No. 5,502,787, issued to F. Capasso et al. on Mar. 26, 1996 under the title "Article Comprising a Semiconductor Waveguide Structure" and commonly assigned herewith, describes a QC laser (without distributed feedback) having a top cladding layer of GaInAs doped to $7 \times 10^{18}$ cm$^{-3}$ and 0.60 µm thick. U.S. Pat. No. 5,502,787 provides formulas for deriving the real and imaginary parts of the refractive index from basic physical properties of the layer material, the doping level, and the pertinent optical wavelength. The same patent shows that for a given layer composition, there is a range of doping levels within which the real and imaginary parts of the refractive index are both relatively low. It is important to have a low real part of the refractive index to provide the desired optical confinement within the cladding and away from the electrode interface. It is important to have a low imaginary part in order to avoid excessive optical loss.

U.S. Pat. No. 5,901,168, cited above, also discloses a highly doped top cladding layer. There, the top cladding layer is made of InP doped to $7 \times 10^{18}$ cm$^{-3}$ and 0.90 µm thick. A grating for distributed feedback is etched to a depth of 0.25 µm in the top cladding layer. The coupling constant κ (a quantity describing the strength of the feedback provided by the grating) was estimated to be about 2–3 cm$^{-1}$.

Alternate structures are disclosed in U.S. Pat. No. 5,901,168, in which the top cladding layer is, respectively, 0.60-µm AlInAs doped to $7 \times 10^{18}$ cm$^{-3}$, and 1.30-µm InP doped to $7 \times 10^{18}$ cm$^{-3}$. The latter was a structure with a buried grating.

In our new structure, such as the structure illustrated in FIG. 2, the combination of PECL and grating is coupled more strongly to the optical mode than has been hitherto disclosed, and as a consequence achieves substantially stronger modulation at least of the real part of the refractive index, and typically also of the imaginary part. The stronger coupling that we achieve is due, at least in part, to the fact that our grating is etched deeply into the PECL, and typically is etched all the way through as shown in the figure.

The stronger coupling is the direct result of substantially removing the PECL material from the grating grooves or valleys. Material must either be entirely removed or else made so thin in the groove regions that it can no longer function as a separation layer between the mode and the metal electrode. Therefore, the choice of thickness is guided by the feasible, and preferably the readily achievable, etch-depth. The latter depends on the etching technique used and also on the grating period. By way of example, etch depths of about 0.3 µm are readily achievable by wet chemical etching when the grating period is approximately 1 µm.

In the present exemplary embodiment, with a grating period of approximately 0.75 µm, a smaller etch-depth (i.e., about 0.2 µm or less) is readily achievable by wet-etching. This consideration led us to choose a PECL thickness of 0.15 µm. Significantly, the smaller thickness of the PECL relative to previous QC-lasers had to be compensated by a higher doping level (the exact value also being influenced by the laser wavelength), to make it effective in the locations near the inter-groove mid-points. Those skilled in the art will appreciate that doping levels sufficient to achieve such compensation are readily determinable from analytical formulas and numerical modeling.

By way of example, it will be typical for lasers emitting in the range 4–5 µm to have a PECL less than 0.25 µm thick, and doped to a concentration of at least $1 \times 10^{19}$ cm$^{-3}$. Similarly, it will be typical for lasers emitting in the range 9–10 µm to have a PECL less than 0.35 µm thick, and doped to a concentration of at least $8 \times 10^{18}$ cm$^{-3}$.

Turning again to FIG. 2, the guided waveguide mode in valleys 25 couples strongly to the metal-semiconductor interface plasmon. This tends to increase the waveguide attenuation coefficient at the valley positions relative to the same coefficient at the positions of ridges 24, where the coupling to the plasmon is suppressed. This also tends to enhance the modal amplitude within the PECL, which induces substantial modulation of the modal effective refractive index and the modal confinement factor. As will be understood by those skilled in the art, the modal confinement factor is a measure of the overlap of the optical mode with the active regions and injectors, and it is intended to be higher in regions of relatively high gain and lower in regions of relatively low gain. For our exemplary structure, we estimate the modulation $n_1$ of the real part of the refractive index to be about $4.52 \times 10^{-3}$ and the modulation amplitude $\alpha_1$ of the absorption coefficient for the laser guided mode to be about 12.8 cm$^{-1}$. Our estimate of the corresponding modulation amplitude $\Gamma_1$ of the modal confinement factor is 0.21.

We have estimated the resulting coupling coefficient $\kappa$ of the grating to be about 16 cm$^{-1}$. In comparison, prior art top-grating devices reached $\kappa$ of only about 2–3 cm$^{-1}$. By contrast, lasers made according to the present invention will typically have $\kappa$ equal to 10 cm$^{-1}$ or more.

The dominant contribution to the coupling coefficient achieved in the present, exemplary embodiment of the invention, by roughly a factor of four, is the modulation of the effective refractive index. To achieve the advantages of our new grating-PECL structure, it will generally be desirable for the modulation amplitude $n_1$ of the effective refractive index to be at least $1 \times 10^{-3}$, and preferably even higher. This is readily achievable, provided the valleys of the grating are etched sufficiently deeply into the PECL. In typical lasers made according to the present invention, the valleys will be etched through at least 85% of the PECL thickness. In at least some cases, it will, in fact, be preferable to etch through 100% of the PECL thickness. As previously stated, the thickness of the PECL is primarily chosen such that etching through the layer is readily achievable.

Figure 3:
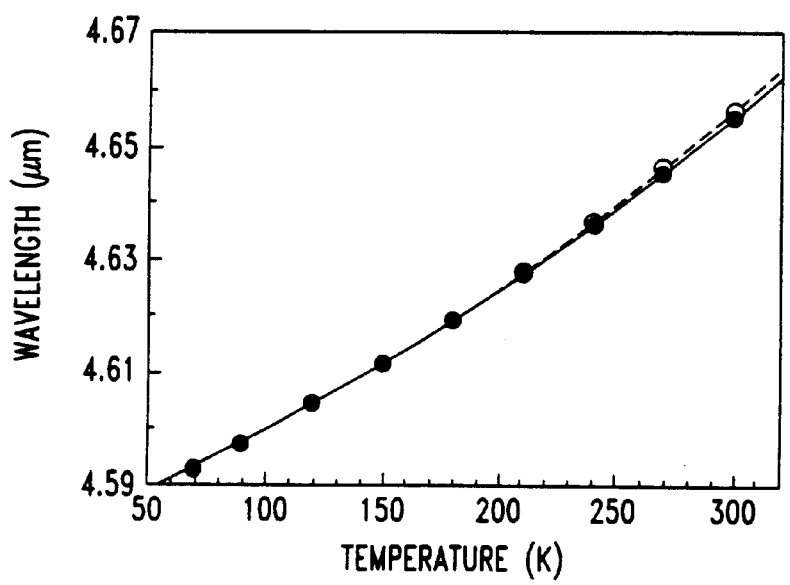
FIGS. 3 and 4 are performance curves for one exemplary embodiment of a QC-DFB laser according to the present invention. The embodiment of FIGS. 3 and 4 has a grating period of 0.73 μm. The performance curves are for pulsed operation.
Figure 4:
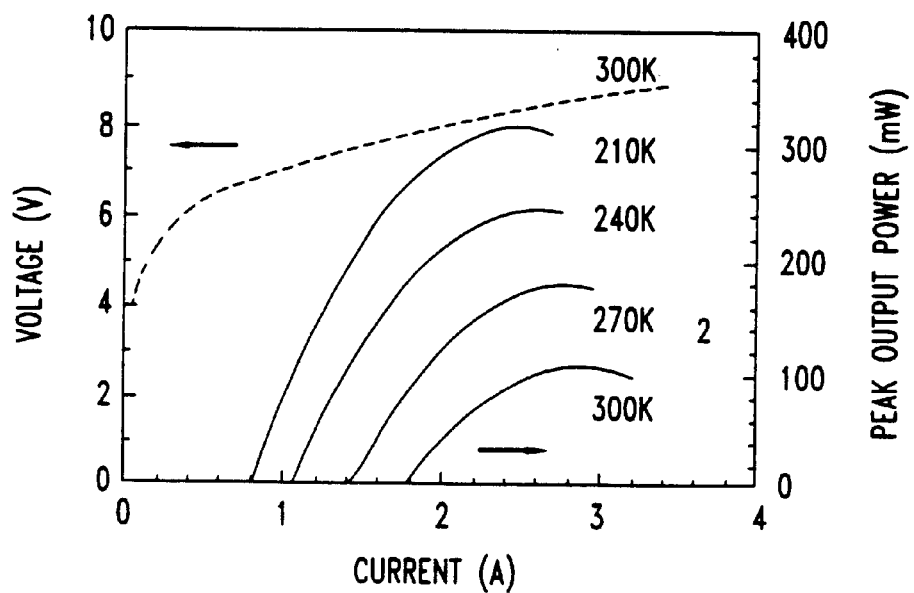

FIGS. 3 and 4 show the performance of an 11 μm wide and 2.25 mm long QC-DFB laser device made substantially as described here with a grating period of 0.73 μm, and operated in pulsed mode with a 50-ns pulse width and 5-kHz repetition rate. FIG. 3 shows the emission wavelength as a function of heat sink temperature. The solid circles are obtained from spectra close to threshold, and the open circles at approximately twice the threshold current. FIG. 4 shows voltage (dashed curve) and optical output power (solid curve) as functions of current. Optical power curves are given for several heat sink temperatures. Light output was collected with approximately 60% collection efficiency from one facet. The laser was single-mode for all current levels shown.

Reliable single-mode output was achieved in the temperature range 90K–300K. In single-mode operation, a side mode suppression ratio of about 30 dB was achieved independent of the current level. A peak power level of 100 mW was achieved at room temperature. A slope efficiency of 180 mW/A was achieved at room temperature and a slope efficiency of 400 mW/A was achieved at low temperatures. The threshold current density at room temperature in pulsed operation was 7 kA/cm$^2$, and the $T_0$ value was 113K. A definition of $T_0$ can be found in C. Gmachl et al., *Appl. Phys. Lett.* 72 (1998) 1430–1432, cited above.

Figure 5:
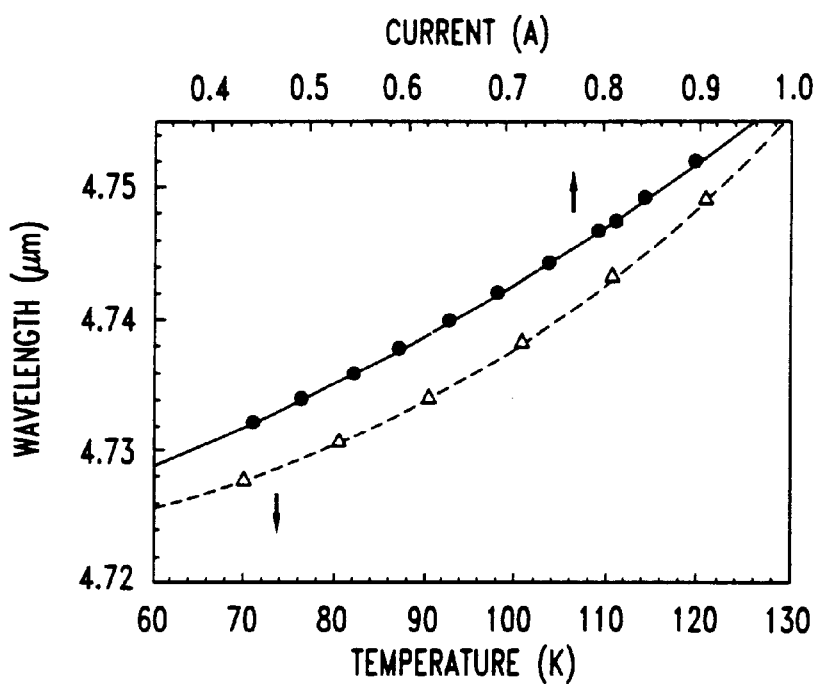
FIGS. 5 and 6 are performance curves for a second exemplary embodiment of a QC-DFB laser according to the present invention. The embodiment of FIGS. 5 and 6 has a grating period of 0.75 μm. The performance curves are for cw operation.
Figure 6:
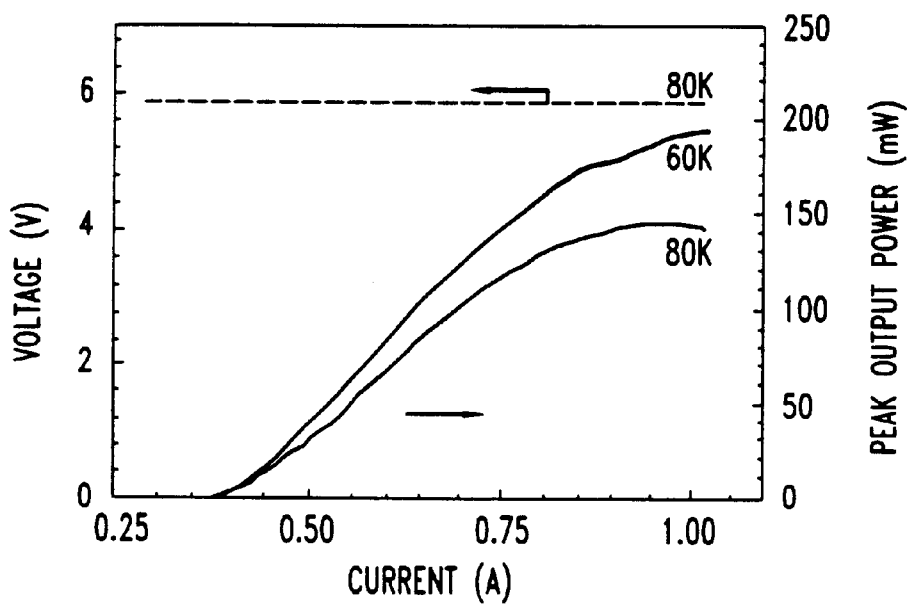

FIGS. 5 and 6 show the performance of a 9 μm wide laser made substantially as described here with a grating period of 0.75 μm and operated cw and single mode. FIG. 5 shows the emission wavelength as a function of the heat sink temperature close to laser threshold (triangles) and as a function of drive current at a constant heat sink temperature of 80K (circles). FIG. 6 shows the voltage (dashed curve) as a function of current at a heat sink temperature of 80K, and also shows the optical output power as a function of current at heat sink temperatures of 60K and 80K.

In cw operation, our linewidth measurement was limited by the resolution of the spectrometer, which was approximately 7.5 GHz.

The maximum cw single-mode output power at 80K was 150 mW, the slope efficiency was less than or equal to 400 mW/A, and the threshold current density was 3.5 kA/cm$^2$.

In general, QC-DFB lasers can advantageously be used in point sensing apparatus and in remote sensing apparatus for spectral analysis and detection of many substances, particularly gaseous substances, having infrared spectral features. Numerous well-known instrumental configurations incorporating a QC-DFB laser are useful in this regard. Without limitation, such configurations include wavelength modulation, direct absorption, photoacoustic cell (PAC), and cavity ring down (CRD) configurations. Published descriptions of spectroscopic instruments incorporating QC-DFB lasers include: R. M. Williams et al., "Kilohertz linewidth from frequency-stabilized mid-infrared quantum cascade lasers," *Optics Letters* 24 (1999) 1844–1846; B. A. Paldus et al., "Photoacoustic spectroscopy using quantum-cascade lasers," *Optics Letters* 24 (1999) 178–180; A. A. Kosterev et al., "Methane concentration and isotopic composition measurements with a mid-infrared quantum-cascade laser," *Optics Letters* 24 (1999) 1762–1764; and K. Namjou et al., "Sensitive absorption spectroscopy with a room-temperature distributed-feedback quantum-cascade laser," *Optics Letters* 23 (1998) 219–221.

Figure 7:
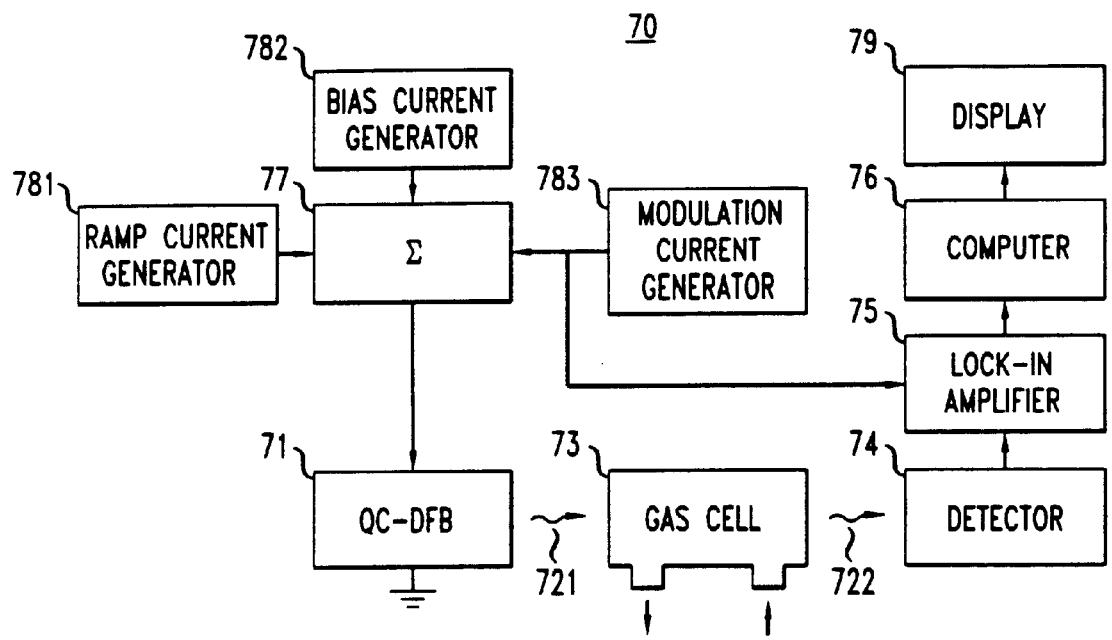
FIG. 7 is a schematic diagram of an exemplary point sensing apparatus incorporating a QC-DFB laser such as the laser described herein.

FIG. 7 schematically depicts exemplary point sensing apparatus 70, wherein numeral 71 refers to a QC-DFB laser according to the invention. For purposes of illustration, the QC-DFB laser of FIG. 7 is configured for wavelength modulation. Typically the laser is mounted on a temperature-controlled stage (not shown) for coarse wavelength tuning. Mid-IR radiation 721 from the laser passes through conventional gas cell 73 (optionally a multi-pass cell), with exited radiation 722 impinging on conventional detector 74. The electrical output of the detector is supplied to lock-in amplifier 75 (together with an appropriate modulation signal, e.g., a 1.2 kHz sine wave from modulation signal generator 783), and the lock-in amplifier output is supplied to computer 76 for data analysis and formatting. The data are then displayed and stored in any suitable manner. The QC-DFB laser is pumped with an appropriate electrical current. For instance, a low frequency current ramp (having, e.g., a 250-ms period) from ramp current generator 781, short bias pulses (e.g., of a 5-ns pulse width and 2-μs period) from bias current generator 782, and a modulation signal from modulation current generator 783 are supplied to combiner 73, and the resultant current ramp with superimposed current pulses and sine wave is applied to the laser. The current ramp serves to sweep the laser temperature over a predetermined range, and the pulses cause the emission of short laser pulses. The pulse wavelength is slowly swept over a range of wavelengths, and absorption as a function of wavelength is determined. Thus, the presence in the cell of a gas that has an absorption line in the range of wavelengths is readily detected, and the gas can be identified. As those skilled in the art will recognize, some conventional features are not shown in FIG. 7. For instance, the measurement set-up will typically be under computer control, requiring further inputs to, and outputs from, the computer.

Figure 8:
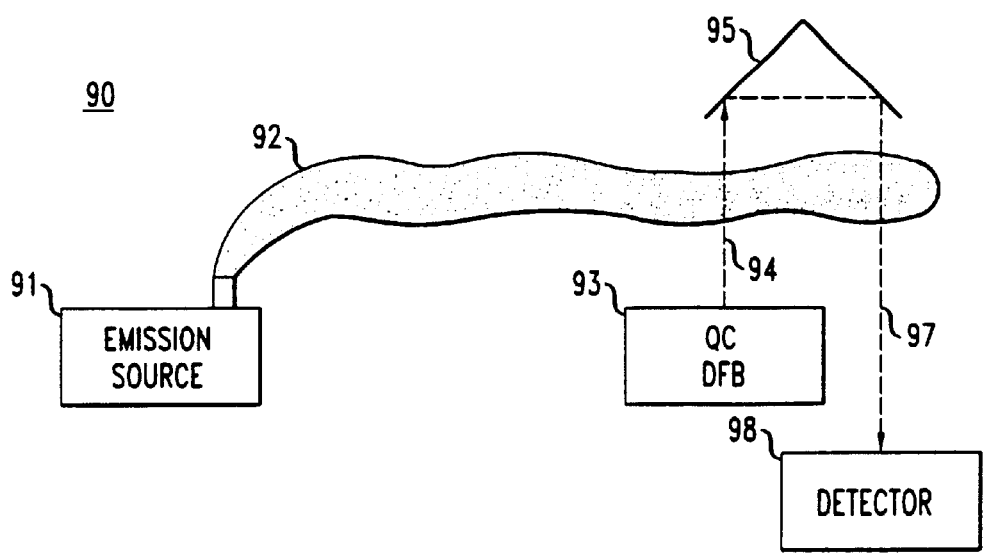
FIG. 8 is a schematic diagram of an exemplary remote-sensing system incorporating a QC-DFB laser such as the laser described herein.

FIG. 8 schematically depicts an exemplary remote-sensing system 90, wherein emission source 91 (e.g., a factory exhaust stack) emits gaseous emission cloud 92. QC-DFB laser 93 emits mid-IR radiation 94 which propagates through the emission cloud, and is reflected exemplarily by a corner reflector 95. Reflected radiation 97 is then detected by detector 98. The laser can be pumped in any appropriate manner, e.g., as described in conjunction with FIG. 7, and the detector output can be utilized in any appropriate manner, e.g., also as described above. A mirror or other appropriate reflector can be used instead of corner reflector 95. The reflector can be on an aircraft or any elevated feature, including the exhaust stack that is being monitored. Of course the detector could also be on an aircraft or elevated feature. In general, any arrangement that results in a line-of-sight disposition of laser and detector is contemplated.

The QC-DFB laser will generally be mounted in an appropriate housing for protection and control. The package will typically comprise cooling means (e.g., water cooling, thermoelectric cooling), temperature sensor means (e.g., a thermocouple) for use in a feedback loop for temperature control, and means for applying the pump current to the laser. The laser is attached in conventional fashion to the cooling means. Optionally, the housing may also contain detector means for controlling laser output power. The housing will typically have a window that is transparent for the laser radiation, and will typically be evacuated or filled with inert gas.

TABLE 1

| Layer Type | Thickness (nm) | Sub-Region | Doping Level |
|---|---|---|---|
| Barrier | 4.4 | Active | |
| Well | 0.9 | Active | |
| Barrier | 0.9 | Active | |
| Well | 4.8 | Active | |
| Barrier | 1.7 | Active | |
| Well | 4.4 | Active | |
| Barrier | 2.8 | Active | |
| Well | 3.4 | Injection | |
| Barrier | 1.2 | Injection | |
| Well | 3.1 | Injection | |
| Barrier | 1.4 | Injection | |
| Well | 2.8 | Injection | $3 \times 10^{17}$ cm$^{-3}$ |
| Barrier | 1.6 | Injection | |
| Well | 2.8 | Injection | $3 \times 10^{17}$ cm$^{-3}$ |
| Barrier | 2.0 | Injection | |
| Well | 2.5 | Injection | $3 \times 10^{17}$ cm$^{-3}$ |
| Barrier | 2.3 | Injection | |
| Well | 2.3 | Injection | |
| Barrier | 2.8 | Injection | |
| Well | 2.1 | Injection | |
| Barrier | 3.0 | Injection | |
| Well | 1.9 | Injection | |

The invention claimed is:

1. Apparatus comprising a quantum cascade, distributed feedback laser having lower and upper cladding regions and a core region, said regions collectively adapted to guide at least one mode of laser radiation, wherein:
   (a) the upper cladding region includes a layer, denominated the plasmon-enhanced confinement layer (PECL), that overlies at least one further layer of the upper cladding region and adjacently underlies a metallic electrode;
   (b) a grating structure is formed as a series of grooves in the PECL;
   (c) the PECL is conformed such that during laser operation, the amplitude of the guided laser mode is relatively enhanced within first portions of the upper cladding region underlying said grooves but is relatively suppressed within second portions of the upper cladding region lying between said first portions, said enhancement and suppression resulting in a modulation of the guided laser mode; and
   (d) said modulation is strong enough to facilitate single-mode cw laser operation.

2. Apparatus of claim 1, wherein the PECL has a layer thickness, and the grooves extend to a depth that is a substantial fraction of the PECL layer thickness.

3. Apparatus of claim 2, wherein the grooves extend to a depth that is at least 85% of the PECL layer thickness.

4. Apparatus of claim 2, wherein the grooves extend entirely through the PECL.

5. Apparatus of claim 1, wherein said laser radiation has a wavelength in the range 4.60–4.75 µm.

6. Apparatus of claim 1, wherein the apparatus is a measurement system for measuring infrared absorption by a target species, wherein:
   the measurement system comprises a source of single-mode infrared laser radiation and a detector for detecting said radiation after it has interacted with a quantity of said target species; and
   said source comprises the quantum cascade, distributed feedback laser of claim 1.

7. The measurement system of claim 6, wherein the target species is a gas disposed in a measurement cell.

8. The measurement system of claim 6, wherein the target species is an unconfined gas.

9. Apparatus of claim 1, further comprising a current source electrically connected to said laser so as to provide a laser-heating current to the laser, such that the laser radiation will vary in wavelength as the laser-heating current is varied.

10. Apparatus of claim 1, wherein the modulation of the guided laser mode is strong enough to facilitate single-mode cw laser operation at a laser temperature of at least 77K.

11. Apparatus comprising a quantum cascade, distributed feedback laser having lower and upper cladding regions and a core region, said regions collectively adapted to guide at least one mode of laser radiation, wherein:
   (a) the upper cladding region includes a layer, denominated the plasmon-enhanced confinement laser (PECL), that overlies at least one further layer of the upper cladding region and adjacently underlies a metallic electrode;
   (b) a grating structure is formed as a series of grooves in the PECL;
   (c) during laser operation, the guided laser mode experiences an effective refractive index; and
   (d) the PECL is conformed so as to modulate said effective refractive index with a modulation amplitude of at least $2 \times 10^{-3}$.

12. Apparatus comprising a quantum cascade, distributed feedback laser having lower and upper cladding regions and a core region, said regions collectively adapted to guide at least one mode of laser radiation, wherein:
   (a) the upper cladding region includes a layer, denominated the plasmon-enhanced confinement laser (PECL), that overlies at least one further layer of the upper cladding region and adjacently underlies a metallic electrode;
   (b) a grating structure is formed as a series of grooves in the PECL;
   (c) during laser operation, the guided laser mode has a degree of overlap with the core region that is quantifiable in terms of a confinement factor; and
   (d) the PECL is conformed so as to modulate the confinement factor with a modulation amplitude of at least 10%.

13. Apparatus comprising a quantum cascade, distributed feedback laser having lower and upper cladding regions and a core region, said regions collectively adapted to guide at least one mode of laser radiation, wherein:

(a) the upper cladding region includes a layer, denominated the plasmon-enhanced confinement laser (PECL), that overlies at least one further layer of the upper cladding region and adjacently underlies a metallic electrode;

(b) a grating structure is formed as a series of grooves in the PECL;

(c) the grating structure is selected to provide distributed optical feedback during laser operation, said feedback quantifiable by a coupling constant; and (d) the PECL is conformed to provide a coupling constant of at least 10 $cm^{-1}$.

14. Apparatus comprising a quantum cascade, distributed feedback laser having lower and upper cladding regions and a core region, said regions collectively adapted to guide at least one mode of laser radiation, wherein:

(a) the upper cladding region includes a layer, denominated the plasmon-enhanced confinement laser (PECL), that overlies at least one further layer of the upper cladding region and adjacently underlies a metallic electrode;

(b) a grating structure is formed as a series of grooves in the PECL;

(c) the PECL has a layer thickness and dopant concentration selected to suppress the amplitude of the guided laser mode near the metallic electrode; and (d) the grooves extend to a depth that is a substantial fraction of the PECL layer thickness.

15. Apparatus of claim 14, wherein the grooves extend to a depth that is at least 85% of the PECL layer thickness.

16. Apparatus of claim 14, wherein the PECL layer thickness is less than 0.35 $\mu$m, and the PECL dopant concentration is at least $8 \times 10^{18}$ $cm^{-3}$.

* * * * *